United States Patent [19]

Tweedy

[11] 4,446,552

[45] May 1, 1984

[54] WIDEBAND SWITCH CROSSPOINT AND SWITCHING MATRIX

[75] Inventor: Ernest P. Tweedy, Lexington, Mass.

[73] Assignee: GTE Laboratories Incorporated, Waltham, Mass.

[21] Appl. No.: 332,983

[22] Filed: Dec. 21, 1981

[51] Int. Cl.³ .............................................. H04J 3/02
[52] U.S. Cl. .......................................... 370/58; 370/6
[58] Field of Search ................................. 370/58, 6, 42

[56] References Cited

U.S. PATENT DOCUMENTS

| 4,075,608 | 2/1978 | Koenig | 370/58 |
| 4,097,693 | 6/1978 | Greefkes | 370/6 |
| 4,345,273 | 8/1982 | Barabas et al. | 370/58 |

Primary Examiner—Douglas W. Olms
Assistant Examiner—Wellington Chin
Attorney, Agent, or Firm—Fred Fisher

[57] ABSTRACT

A wideband switch crosspoint and crosspoint matrix can be provided in which direct current through a multiplex switching means enables additional circuitry and extends attenuation between the "on" and the "off" states of the switching means.

5 Claims, 5 Drawing Figures

WIDEBAND SWITCH CROSSPOINT AND SWITCHING MATRIX

BACKGROUND OF THE INVENTION

1. Field of the Invention

This invention relates both to a wideband switch crosspoint and to a crosspoint switching matrix. Accordingly, it is a general object of this invention to provide new and improved apparatus of such character.

2. Objects of the Invention

Another object of this invention is to provide for a new and improved switching matrix for distributing a selection of library program sources to individual users. Especially, it is desirable for any source to be switched to any one or more than one user.

Still yet another embodiment to this invention is to provide for a new and improved system in which the library can include a collection of organized information used for study and reference and, in addition to narrow band sources, can include any of three vestigial side band television channels.

Yet still another embodiment to this invention is to provide for a new and improved switching matrix that is designed to operate over a band from 0.1 MHz to over 20 MHz.

Still yet another embodiment of this invention is to provide for a new and improved wideband switch crosspoint which yields an on-off ratio of at least 80 dB at frequencies up to 20 MHz.

Yet still another embodiment of this invention is to provide for a new and improved crosspoint matrix which is modular and can be conveniently extended to up to 16384 crosspoints.

3. Description of the Prior Art

Various switches have been developed in the past to meet similar requirements in the television industry, including broadband amplifiers, broadband switches, and matrix switches for baseband video having generally a bandwidth which does not exceed 10 MHz. Other prior art switches in the television industry are utilized in cameras, video tape recorders and other video devices having a general bandwidth of 10 MHz. Such prior art television studio switches tend to be expensive. Other prior art switching devices are used in association with high frequency antenna farms. Other art include military applications, such as, for example, connecting any one of ten antennas to any one of ten receivers. Military applications are usually expensive in comparison to commercial applications.

SUMMARY OF THE INVENTION

In accordance with one embodiment of this invention, a wideband switch crosspoint includes an n channel multiplex switching means having corresponding channel inputs thereto and output and controls therefor. The multiplex switching means has an attenuation between an "on" and an "off" condition in a range 30 dB to 40 dB at a frequency of 20 MHz. An output transistor has its control electrode coupled to the output of the multiplex switching means. A first resistor couples the output of the multiplex switching means to a voltage source having a first polarity. An intermediate transistor has its collector adapted to be coupled to a voltage source of the opposite polarity. A first diode has a first electrode coupled to the emitter of the intermediate transistor, and a second diode has a first electrode coupled to a second electrode of the first diode. The second diode has its second electrode coupled to a point of reference potential. The base/emitter, the first diode first electrode-second electrode, the second diode first electrode-second electrode, and the opposite polarity/reference potential are all poled in a common direction. A second resistor is coupled between the collector and the first electrode of the second diode. An initial transistor stage has its input adapted to be coupled to a program source, and has an output which is coupled to the base of the intermediate transistor, providing a small dc voltage of the first polarity thereto. Means are provided for coupling the first electrode of the second diode to one of the channel inputs. Thus, when the multiplex switching means is controlled "on" with respect to one of the channel inputs, a voltage at the first polarity is applied from the output of the multiplex switching means to the first electrode of the second diode, providing for conduction through the intermediate transistor and the first diode, and providing for nonconduction through the second diode. This permits a signal from the program source to pass through the initial transistor stage, the intermediate transistor, the first diode, the multiplex switching means, and the output transistor. When the multiplex switching means is controlled "off" with respect to one of the channel inputs, the voltage source at the opposite polarity causes a current to flow through the second resistor and the second diode to the point of reference potential. This causes the first electrode of the second diode to be maintained at a small voltage of the opposite polarity, turning "off" the first diode and causing non-conduction of the intermediate transistor. As a result, the wideband switch crosspoint has an overall attenuation between an "on" and an "off" condition in excess of 80 dB at a frequency of 20 MHz. n is a positive integer. According to certain features of the invention, n can equal eight. The output transistor can be of an NPN type, the intermediate transistor can be of an NPN type, the first polarity can be negative, and the opposite polarity can be positive. Each of the first electrodes can be an anode, and each of the second electrodes can be a cathode.

In accordance with another embodiment of the invention, a new and improved 64-crosspoint switching matrix for enabling any one or more of eight users to be individually switched selectively to any one or more of eight program sources can include eight 8-channel multiplex switching means having corresponding channel inputs thereto and individual output and individual controls therefor. The multiplex switching means each has an attenuation between an "on" and an "off" condition in a range 30 dB to 40 dB at a frequency of 20 MHz. Eight output transistors each has a corresponding control electrode coupled to a respective individual output of a respective multiplex switching means. Eight individual resistors respectively couple each respective individual output of a respective multiplex switching means to a voltage source of a first polarity. Sixty-four intermediate transistors each has a collector adapted to be coupled to a voltage source of an opposite polarity. Sixty-four diodes each has a first electrode coupled to a respective one of the emitters. Sixty-four second diodes each has a first electrode coupled to a respective second electrode of a respective first diode and each has a second electrode coupled to a point of reference potential. Each of the bases/emitters, the first diodes first electrodes/second electrodes, the second diodes first electrodes/second electrodes, and the opposite polarity/reference potential is poled in a common direction. Sixty-four coupling resistors, each respectively couples one of the collectors to a respective one of the first electrodes of the respective second diode. Eight initial transistor stages each has an input adapted to be respectively coupled to a respective one of the eight program sources, each transistor stage having an output coupled to the bases of eight respective intermediate transistors, each intermediate transistor being associated with one channel representing one program source for each of the eight multiplex switching means for providing a small dc voltage of the first polarity to the bases of the eight respective intermediate transistors. Individual means are provided for coupling each of the first electrodes of the second diodes to a respective one of the channel inputs. Thus, when any one of the multiplex switching means is controlled "on" with respect to one of its channel inputs, a voltage at the first polarity is applied from the output of the multiplex switching means to the first electrode of its associated second diode, providing for conduction through the associated intermediate transistor and the associated first diode, and providing for non-conduction through the associated second diode. This permits a signal from a selected one of the program sources to pass through its associated transistor stage, its associated intermediate transistor, its associated first diode, the multiplex switching means, and its associated output transistor. When any one of the multiplex switching means is controlled "off" with respect to one of its channel inputs, the voltage source at the opposite polarity causes a current to flow through the associated second resistor and the associated second diode to the point of reference potential, so that the associated first electrodes of the second diodes are maintained at a small voltage of the opposite polarity, turning off respective ones of the first diodes and causing non-conduction of respective ones of the intermediate transistors. In such embodiment, the switching matrix has an overall attenuation between an "on" and an "off" condition in excess of 80 dB at a frequency of 20 MHz.

BRIEF DESCRIPTION OF THE DRAWING

Other objects, advantages, and features of this invention, together with its construction and mode of operation, will become more apparent from the following description, when read in conjunction with the accompanying drawing, in which.

DESCRIPTION OF PREFERRED EMBODIMENTS

Figure 4B:
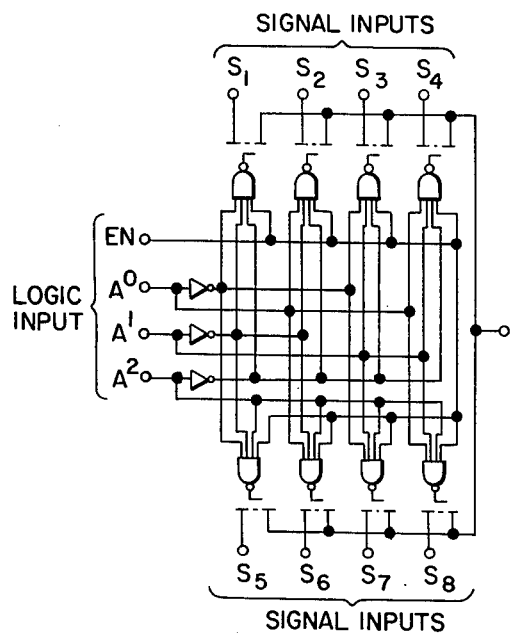
FIGS. 4A and 4B are a schematic diagram and a functional diagram, respectively, of a commercially available DG 501 8-channel multiplex switch with decode, as described in Analog Switch Data Book by Siliconix Incorporated, 2201 Laurelwood Road, Santa Clara, Calif. 95054.
Figure 4A:
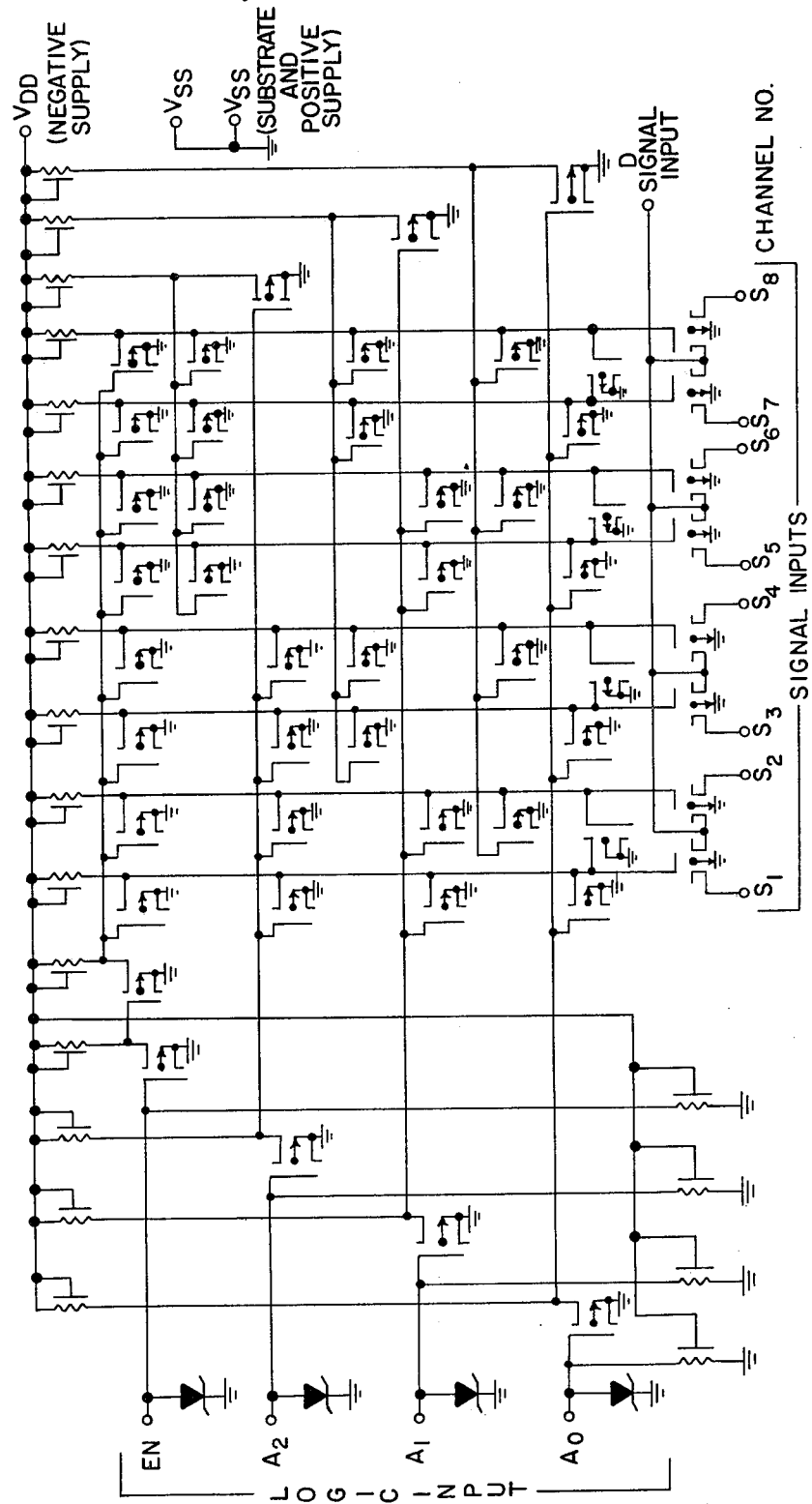

Embodiments of this invention utilize an 8-channel multiplex switch including a digital encoder such as a Siliconix DG 501 integrated circuit whose schematic and functional diagrams are shown, respectively, in FIGS. 4A and 4B. The Siliconix circuit is unable, by itself, to provide the isolation of over 80 dB which is preferred by the applicants hereof. The Siliconix DG 501 integrated circuit generally has an attenuation between an "on" and "off" condition in a range of 30 dB to 40 dB at a frequency of 20 MHz.

Figure 1:
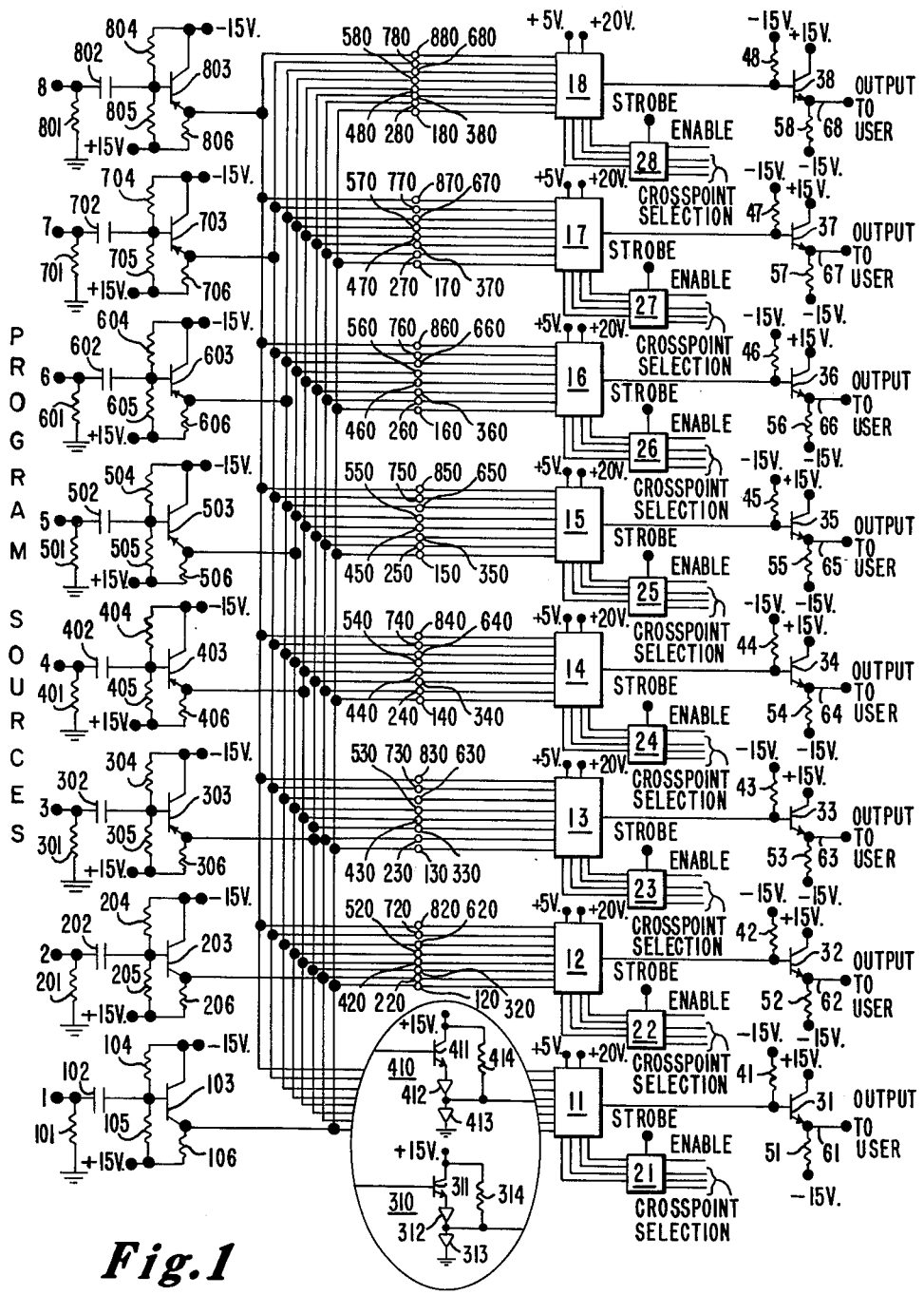
FIG. 1 is a block diagram of one embodiment of this invention with a portion thereof shown in exploded detail.

FIG. 1 is a block diagram of a 64-crosspoint switching matrix for enabling any one or more of eight users to be individually switched selectively to any one or more of eight program sources. The switching matrix, as depicted in FIG. 1, includes eight 8-channel multiplex switching means 11, 12, 13, 14, 15, 16, 17, 18, each of which can be a commercially available Siliconix DG 501 integrated circuit or an equivalent 8-channel multiplex switch, including a digital decoder such as is commercially available in a 16-pin dual-in-line package. A digital decoder, if provided separately, can include decoders 21, 22, 23, 24, 25, 26, 27, 28 for controlling the multiplex switching means 11, 12, 13, 14, 15, 16, 17, 18, respectively.

Eight output transistors 31, 32, 33, 34, 35, 36, 37, 38 each has a corresponding control electrode (such as its base) coupled to a respective individual output of the respective multiplex switching means 11, 12, 13, 14, 15, 16, 17, 18.

Eight individual resistors 41, 42, 43, 44, 45, 46, 47, 48 respectively couple each respective individual output of the respective multiplex switching means 11, 12, 13, 14, 15, 16, 17, 18 to a voltage source of a first polarity, such as −15 V.

Sixty-four intermediate transistors and their associated circuitry are designated in FIG. 1 with three-digit reference numerals ending with zero, as, for example, 180, 280, 380, 480, 580, 680, 780, 880 (associated with the multiplex switching means 18). The associated circuitry is depicted as a small circle at various portions of FIG. 1. Two of the eight associated circuitry for the multiplex switching means 11 is depicted in FIG. 1 in exploded detail as 310 and 410. The 64 intermediate transistors as, for example, 111 (FIG. 2), 311, 411 each has a collector adapted to be coupled to a voltage source of an opposite polarity, such as, for example, +15 V.

Sixty-four first diodes 112, 312, 412 each has a first electrode (such as its anode) coupled to respective one of the emitters of the transistors, such as transistors 111, 311, 411.

Sixty-four second diodes, such as, for example, diodes 113, 313, 413 each has a first electrode (such as its anode) coupled to the second electrode (e.g., cathode) of a respective first diode 112, 312, 412, and each has a second electrode (e.g., cathode) coupled to a point of reference potential.

Each of the bases/emitters of the transistors 111, 211 . . . 811, the first diodes anodes/cathodes, the second diodes anodes/cathodes, and the opposite polarity/reference potential is all poled in a common direction.

Sixty-four coupling resistors 114, 314, 414 each respectively couples one of the collectors of the transistors 111, 311, 411 to a respective one of the anodes of a respective second diode 113, 313, 413.

Eight initial transistor stages including transistors 103, 203, 303, 403, 503, 603, 703, 803 each has an input adapted to be respectively coupled to one of the eight program sources 1, 2, 3, 4, 5, 6, 7, 8. The program sources are coupled through resistors 101, 201, 301, 401, 501, 601, 701, 801 to ground and are also coupled through capacitors 102, 202, 302, 402, 502, 602, 702, 802, respectively, to the bases of the transistors 103, 203, 303, 403, 503, 603, 703, 803. The bases of the foregoing transistors are all coupled by respective resistors 104, 204, 304 . . . 804 to a point of negative potential, such as −15 V. The respective collectors of the corresponding transistors are coupled to the negative potential of −15 V. The bases of the transistors 103, 203, 303, 403 . . . 803 are coupled via respective resistors 105, 205, 305, 405 . . . 805 to a point of positive potential, such as +15 V. The transistors 103, 203, 303 . . . 803, which are of the PNP type, have their respective emitters individually coupled via resistors 106, 206, 306, 406 . . . 806 to a point of positive potential, such as +15 V.

The output of the input stage 103 (at its emitter) is coupled to eight respective intermediate transistors 111, 121, 131, 141, 151, 161, 171, 181. Similarly, the program source 6 has the output of the initial stage 603, from the resistor 606, coupled to eight intermediate transistors 611, 621, 631, 641, 651, 661, 671, 681. Each of the foregoing intermediate transistors is associated with one channel representing one program source for each of the eight multiplex switching means. For example, the transistor 111 is associated with the first channel and is associated with the switching means 11. The transistor 651 is associated with the sixth program source and with the fifth switching means 15. Small dc voltages are applied at a first polarity to the bases of the eight respective intermediate transistors.

Individual means couple each of first electrodes of the second diodes to a respective one of the channel inputs. That is, the input of each of the switching means 11, 12 is coupled at the junctions of the diodes 112, 113; 212, 213; 312, 313; etc.

Thus, when any one of the multiplex switching means 11, 12, 13 . . . 18 is controlled "on" with respect to any of its channel inputs, a voltage at the first polarity (e.g., −15 V) is applied from the output of the multiplex switching means 11, 12 to the first electrode (i.e., the anode) of the associated second diode, providing for conduction through the associated intermediate transistor (e.g., 111) and associated first diode (e.g., 112), and provides for non-conduction through the associated second diode, such as diode 113. Thus, a signal is permitted to pass from a selected one of the program sources through the associated transistor stage, i.e., stage 103 (FIG. 2), its associated intermediate transistor (111, see FIG. 2), its associated first diode 112, the multiplex switching means 111, and its associated output transistor 31.

When any one of the multiplex switching means is controlled "off" with respect to one of its channel inputs, the voltage source at the opposite polarity (such as +15 V) causes a current to flow through the associated second resistor (such as resistor 114) and the associated second diode 113 to the point of reference potential so that the associated first electrode (e.g., anode) of the second diode 113 is maintained at a small voltage (such as +0.7 V) of the positive polarity, turning "off" the respective ones of the first diodes 112 and causing non-conduction of the respective intermediate transistors, such as 111. With such a matrix, the overall attenuation between an "on" and an "off" condition is in excess of 80 dB at a frequency of 20 MHz.

Figure 2:
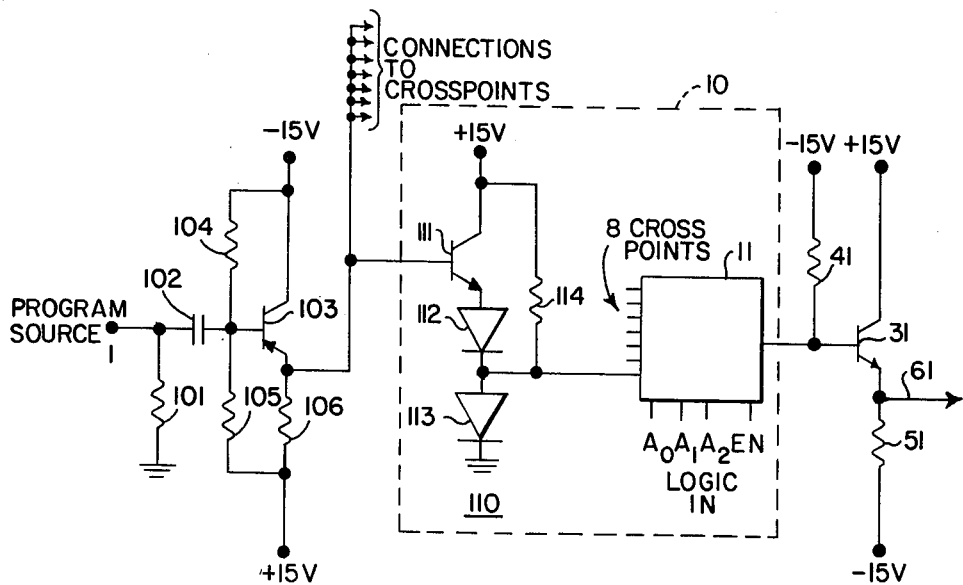
FIG. 2 is a detailed view illustrating another embodiment of this invention.

Referring more particularly to FIG. 2, a wideband switch crosspoint includes an 8-channel multiplex switching means 11 having corresponding channel inputs thereto and controls therefor. The multiplex switching means 11 has an attenuation between an "on" and an "off" condition in a range of 30 dB to 40 dB at a frequency of 20 MHz. An output transistor 31 has its base coupled to the output of the multiplex switching means 11. A first resistor 41 couples the output of the multiplex switching means 11 to a −15 volts voltage source. An intermediate transistor 111 has its collector adapted to be coupled to a +15 volts source and has a first diode 112 with its anode coupled to the emitter. A second diode 113 has its anode coupled to the cathode of the diode 112. The cathode of the diode 113 is coupled to ground. The base/emitter of the transistor 111, the anode/cathode of the diode 112, the anode/cathode of the diode 113, and the voltage polarity of the collector of the transistor 111 with respect to ground are all poled in a common direction.

A second resistor 114 is coupled between the collector of the transistor 111 and the anode of the diode 113. An initial transistor 103 stage has an input adapted to be coupled to a program source 1; and has its output coupled to provide a small negative dc voltage to the base of the transistor 111.

The anode of the cathode 113 is coupled to one of the channel inputs of the multiplex switching means 11.

When the multiplex switching means 11 is controlled "on" with respect to one of the channel inputs, a voltage at the negative polarity is applied, via the resistor 41, through the switching means 11 to the anode of the diode 113, providing for conduction through the transistor 111 and the diode 112 and providing for non-conduction through the diode 113. Thus, a signal is permitted to pass from the program source 1, through the initial transistor stage 103, the intermediate transistor 111, the first diode 112, the multiplex switching means 11, and the output transistor 31.

When the multiplex switching means 11 is controlled "off" with respect to that one of the channel inputs, the +15 volts voltage source causes a current to flow through the resistor 114 and the diode 113 to ground, maintaining the anode of the diode 113 at approximately +0.7 V. Thus, the first diode 112 is turned "off", and the transistor 111 ceases conduction. The wideband switch crosspoint of this invention thus realizes an overall attenuation between an "on" and an "off" condition in excess of 80 dB at a frequency of 20 MHz.

In the embodiment disclosed herein, without limiting the scope of this invention whatsoever, the output and intermediate transistors can be of an NPN type.

A feature of this invention resides in that each crosspoint on the eight-channel switch is used to both connect and disconnect the applied program signal, and to connect and disconnect dc power through the multiplex switching means to the various additional components to provide for an additional 40 dB to 50 dB attenuation between switch "on" and "off" states.

Figure 3:
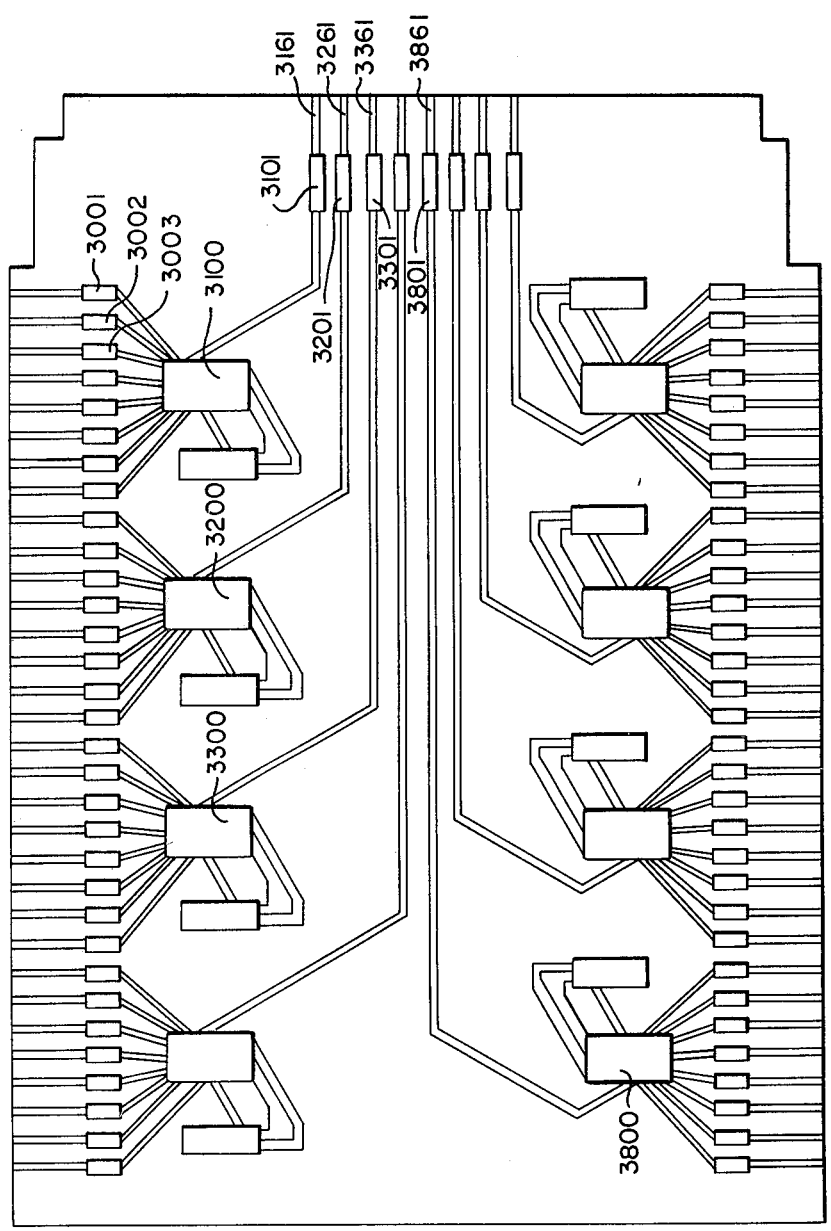
FIG. 3. is a block diagram of a third embodiment of the invention illustrating its usage on a printed circuit board.

FIG. 3 is a block diagram of a printed circuit board illustrating a possible layout for 64 inputs from program sources, each going to separate driving stages 3001, 3002, 3003, etc. The eight driving stages are respectively coupled to individual multiplex switching means 3100, 3200, 3300 . . . 3800. The outputs of the multiplex switching means 3100, 3200, 3300 . . . 3800 are coupled via output transistor stages 3101, 3201, 3301 . . . 3801 to respective output lines 3161, 3261, 3361 . . . 3861.

In accordance with the foregoing invention, a single 64 crosspoint matrix can be provided on a printed circuit board. A single eight-way switch which provides eight crosspoints (such as the DG 501 Siliconix switch with a 16-pin dual-in-line package quad latch) can utilize 16 diodes, 9 transistors and 10 resistors. The eight program drivers utilize 32 resistors, 8 transistors and 8 capacitors, each capable of driving up to eight inputs in eight different multiplex switching means such as DG 501's. A program source signal is connected to a high input impedance emitter follower transistor 103, the output of which is applied as inputs to eight single pole eight-way switches.

The −2.5 dc voltage from the emitter of the transistor 103 and the modulation (peak of 25 mV rms) are connected to the base of the NPN transistor 111. When the eight-way switch 11 is in an "off" condition, the NPN transistor 111 is non-conducting because its base is biased at −2.5 volts with its emitter connected, via the diode 112 to +0.7 volt. The +0.7 volt is due to the voltage drop across the diode 113 from current originating from the +15 volts supply through the resistor 114. The reverse voltage across the diode 112 results in a small capacity of about 0.5 pf. The diode 112 can be omitted if the transistor 111 is selected to provide a low enough capacity across the base-emitter junction with reverse bias. Signal attenuation results from the impedance of the slow capacity connected into the low impedance of the forward conducting diode 112, resulting in attenuation of 45 dB to 50 dB at 20 MHz. When a program source is selected by the eight-way switch 11, the −15 volts is connected to the junction of the diodes 112, 113 via the resistor 41; the switch crosspoint resistance tends to be in the neighborhood of 200 ohms. These resistances in series become the emitter-load resistance of the transistor 111 operating as an emitter follower with a high input impedance. The diodes 112, 113 are biased to non-conducting and conducting states, respectively.

The output of the multiplex switch 111 has a capacitance of about 20 pf to ground. This results in a loss that increases with increasing frequency. The crosspoint also involves an insertion loss between 1 dB to 2 dB. If desired, both losses could be compensated in a subsequent circuit. When more than eight program sources are required, output from two or more multiplex switches 11, 12, etc. can be summed by output transistors, thus providing for increments of eight program source groups. Thus, for example, 32 program sources could be made available to two users on one 64-crosspoint printed circuit board.

Crosspoint (telephone switching systems) is defined in IEEE Standard 312-1977 "Terms for Communication, Definitions of" as: "A controlled device used in extending a transmission or control path." The selection of a crosspoint can be obtained by applying a 3-bit signal into the latch accompanied by a steady enable signal. When a strobe pulse is applied, flip-flops in the latch are operated and maintain a steady input set of logic levels into the switch. An enable signal permits the switch to close the selected crosspoint. When the enable signal is absent, no crosspoint in the switch is activated, whereby no signal is applied to the user.

In summary, referring to FIG. 2, when the multiplex switch 11 couples the −15 volts, via the transistor 41, to the anode of the diode 113, a negative voltage is applied to the junction of the diodes 112, 113. As the base of the transistor 111, at −2.5 volts, is more positive with respect to its emitter, conduction occurs therethrough. With the collector of the transistor 111 maintained at a positive potential with respect to the emitter thereof, a signal applied at its base from the program source is permitted to travel through the transistor 111 and the conducting diode 112, through the input of the multiplex switch 111, and through the output line 61 of the transistor 31.

When the multiplex switching means 11 is "off", the +15 volts at the collector of the transistor 111 causes a current to pass through the resistor 114, through the diode 113 to ground, whereby the voltage at the junction of the diodes 112, 113 becomes approximately +0.7 volt. This +0.7 volt is positive with respect to the base of the transistor 111 which is maintained at +2.5 volts so that the diode 112 is turned "off". Also, the transistor 111 is turned "off" so that any signal which may be applied at the base of the transistor 111 does not pass therethrough nor through the diode 112. However, any leakage which happens to pass through the transistor 111 and the diode 112 finds a path to ground through the conducting diode 113.

Any remaining leakage which passes through the input of the switch 11 encounters another 40 dB of loss. There is a 40 dB loss for the switch 11, and at least 40 dB of loss across the remaining circuitry including the transistors and the diodes.

Various modifications may be performed by those skilled in the art without departing from the spirit and scope of this invention.

What is claimed is:

1. A wideband switch crosspoint comprising
    an n-channel multiplex switching means having corresponding channel inputs thereto, an output, and controls therefor, said multiplex switching means having an attenuation between an "on" and an "off" condition in a range 30 dB to 40 dB at a frequency of 20 MHz;
    an output transistor having a control electrode coupled to said output of said multiplex switching means;
    a first resistor for coupling said output of said multiplex switching means to a voltage source of a first polarity;
    an intermediate transistor having a collector adapted to be coupled to a voltage source of an opposite polarity, a base, and an emitter;
    a first diode having a first electrode coupled to said emitter, and having a second electrode.
    a second diode having a first electrode coupled to said second electrode of said first diode, and having a second electrode coupled to a point of reference potential,
        said base-emitter, said first diode first electrode-second electrode, said second diode first electrode-second electrode, and said opposite polarity-reference potential being poled in a common direction;
    a second resistor coupled between said collector and said first electrode of said second diode;
    an initial transistor stage having an input adapted to be coupled to a program source, and having an output coupled to, and adapted to provide a small d.c. voltage at said first polarity to, said base; and
    means for coupling said first electrode of said second diode to one of said channel inputs, whereby,
    when said multiplex switching means is controlled "on" with respect to said one of said channel inputs, a voltage at said first polarity is applied from said output of said multiplex switching means to said first electrode of said second diode, providing for conduction through said intermediate transistor and said first diode, and providing for non-conduction through said second diode, thereby permitting a signal from said program source to pass through said initial transistor stage, said intermediate transistor, said first diode, said multiplex switching means, and said output transistor, and when said multiplex switching means is controlled "off" with respect to said one of said channel inputs, said voltage source at said opposite polarity causes a current to flow through said second resistor and said second diode to said point of reference potential so that said first electrode of said second diode is maintained at a small voltage of said opposite polarity, turning off said first diode and causing nonconduction of said intermediate transistor, and whereby said wideband switch crosspoint has an overall attenuation between an "on" and an "off" condition in excess of 80 dB at a frequency of 20 MHz, and wherein n is a positive integer.

2. The wideband switch crosspoint as recited in claim 1 wherein n equals eight.

3. The wideband switch crosspoint as recited in claim 1 wherein said output transistor is of an NPN type, said intermediate transistor is of an NPN type, said first polarity is negative, said opposite polarity is positive, each of said first electrodes is an anode, and each of said second electrodes is a cathode.

4. The wideband switch crosspoint as recited in claim 3 wherein n equals eight.

5. A 64-crosspoint switching matrix for enabling any one or more of eight users to be individually switched selectively to any one or more of eight program sources comprising eight 8-channel multiplex switching means having corresponding channel inputs thereto, individual output, and individual controls therefor, said multiplex switching means each having an attenuation between an "on" and an "off" condition in a range 30 dB to 40 dB at a frequency of 20 MHz;

eight output transistors each having a corresponding control electrode coupled to a respective said individual output of a respective multiplex switching means;

eight individual resistors for respectively coupling each respective said individual output of a respective multiplex switching means to a voltage source of a first polarity;

sixty-four intermediate transistors each having a collector adapted to be coupled to a voltage source of an opposite polarity, a base, and an emitter;

sixty-four diodes each having a first electrode coupled to a respective one of said emitters, and having a second electrode;

sixty-four second diodes each having a first electrode coupled to a respective second electrode of a respective said first diode, and each having a second electrode coupled to a point of reference potential, each of said bases-emitters, said first diodes first electrodes-second electrodes, said second diodes first electrodes-second electrodes, and said opposite polarity-reference potential being poled in a common direction;

sixty-four coupling resistors each respectively coupling one of said collectors to a respective one of said first electrodes of a respective said second diode;

eight initial transistor stages each having an input adapted to be respectively coupled to a respective one of said eight program sources, each said transistor stage having an output coupled to said bases of eight respective intermediate transistors, each intermediate transistor being associated with one channel representing said one of said program sources for each of said eight multiplex switching means, for providing a small d.c. voltage of said first polarity to said bases of said eight respective intermediate transistors; and individual means for coupling each said first electrode of said second diodes to a respective one of said channel inputs, whereby when any one of said multiplex switching means is controlled "on" with respect to one of its said channel inputs, a voltage at said first polarity is applied from said output of such multiplex switching means to said first electrode of its associated said second diode, providing for conduction through the associated said intermediate transistor and associated first diode, and providing for nonconduction through the associated second diode, thereby permitting a signal from a selected one of said program sources to pass through its associated said transistor stage, its associated said intermediate transistor, its associated first diode, such multiplex switching means, and its assodiated said output transistor; and when any one of said multiplex switching means is controlled "off" with respect to one of its channel inputs, said voltage source at said opposite polarity causes a current to flow through the associated said second resistor and the associated second diode to said point of reference potential so that the associated said first electrodes of said second diodes are maintained at a small voltage of said opposite polarity, turning off respective ones of said first diodes and causing nonconduction of respective ones of said intermediate transistors;

and whereby said switching matrix has an overall attenuation between an "on" and an "off" condition in excess of 80 dB at a frequency of 20 MHz.

* * * * *